US008354667B2

United States Patent
Chen et al.

(10) Patent No.: US 8,354,667 B2
(45) Date of Patent: Jan. 15, 2013

(54) ORGANIC ELECTROLUMINESCENCE MANUFACTURING METHOD AND IMAGE DISPLAY SYSTEM HAVING THE SAME

(75) Inventors: Eng Jay Chen, Miaoli County (TW); Ryuji Nishikawa, Hsinchu (TW)

(73) Assignee: Chimei Innolux Corporation, Maioli County (TW)

( * ) Notice: Subject to any disclaimer, the term of this patent is extended or adjusted under 35 U.S.C. 154(b) by 306 days.

(21) Appl. No.: 12/662,927

(22) Filed: May 12, 2010

(65) Prior Publication Data
US 2010/0320447 A1    Dec. 23, 2010

Related U.S. Application Data

(60) Provisional application No. 61/213,175, filed on May 14, 2009.

(30) Foreign Application Priority Data

Dec. 16, 2009   (TW) ................................ 98143088 A

(51) Int. Cl.
*H01L 51/00*    (2006.01)

(52) U.S. Cl. ................... 257/40; 257/103; 257/E51.018; 257/E51.026; 257/E33.003; 438/46

(58) Field of Classification Search .................... 257/40, 257/103, E51.018, E51.026, E33.003; 438/46
See application file for complete search history.

(56) References Cited

U.S. PATENT DOCUMENTS

2010/0068468 A1* 3/2010 Coe-Sullivan et al. ........ 428/172
2011/0127932 A1* 6/2011 Halpert et al. ................ 315/363

* cited by examiner

*Primary Examiner* — Tu-Tu Ho
(74) *Attorney, Agent, or Firm* — Stites & Harbison, PLLC; Juan Carlos A. Marquez, Esq.

(57) ABSTRACT

An organic electroluminescence device manufacturing method and an image display system having the organic electroluminescence device are provided. The manufacturing method includes the steps of providing a substrate, forming a first electrode on the substrate, forming an organic layer having a plurality of crystals on the first electrode, and forming a second electrode on the organic layer. Each of the crystals comprises a particle.

15 Claims, 4 Drawing Sheets

ORGANIC ELECTROLUMINESCENCE MANUFACTURING METHOD AND IMAGE DISPLAY SYSTEM HAVING THE SAME

CROSS REFERENCE TO RELATED APPLICATIONS

This application claims the right of priority based on U.S. provisional application No. 61/213,175 filed on May 14, 2009, and Taiwan Patent Application No. 98143088 entitled "ORGANIC ELECTROLUMINESCENCE MANUFACTURING METHOD AND IMAGE DISPLAY SYSTEM HAVING THE SAME" filed on Dec. 16, 2009, which are incorporated herein by reference and assigned to the assignee herein.

FIELD OF THE INVENTION

This invention relates to an organic electroluminescence device, a method for manufacturing the same, and an image display system having the same. The organic electroluminescence device, the manufacturing method and the image display system of the present invention are provided with improved charge injection ability and luminescence performance.

BACKGROUND OF THE INVENTION

The organic electroluminescence device, also called as organic light emitting diode (OLED), has a great application potential to become a mainstream of the next generation of flat-panel displays due to its advantages of self luminescence, no viewing-angle dependence, saving power, simple manufacturing process, low cost, low working temperature, high response speed and full-color.

In order to enhance luminescence performance of the organic electroluminescence devices, current technologies utilize methods such as materials improvement, device structures adjustment and optical modeling modification. Such methods, however, usually accompany high research cost, complicated processes and other drawbacks, which are unfavorable to mass production of the organic electroluminescence devices.

SUMMARY OF THE INVENTION

In light of the foregoing, it is one object of the present invention to provide an organic electroluminescence device, a method for manufacturing the same, and an image display system having the same, which are provided with improved charge injection ability and luminescence performance.

To achieve above and other objects, one embodiment of the present invention provides a method for manufacturing an organic electroluminescence device, the method comprises providing a substrate, forming a first electrode on the substrate, forming an organic layer having a plurality of crystals on the first electrode, and forming a second electrode on the organic layer. Each of the crystals comprises a particle.

Another embodiment of the present invention provides an image display system, which comprises a substrate, a first electrode on the substrate, an organic layer including an emitting film on the first electrode, and a second electrode on the organic layer. The organic layer comprises a plurality of crystals, and each of the crystals comprises a particle.

The objects, features and advantages of the present invention may be better understood by reference to the detailed description with the accompanying drawings hereinafter.

DETAILED DESCRIPTION OF THE INVENTION

Figure 1:
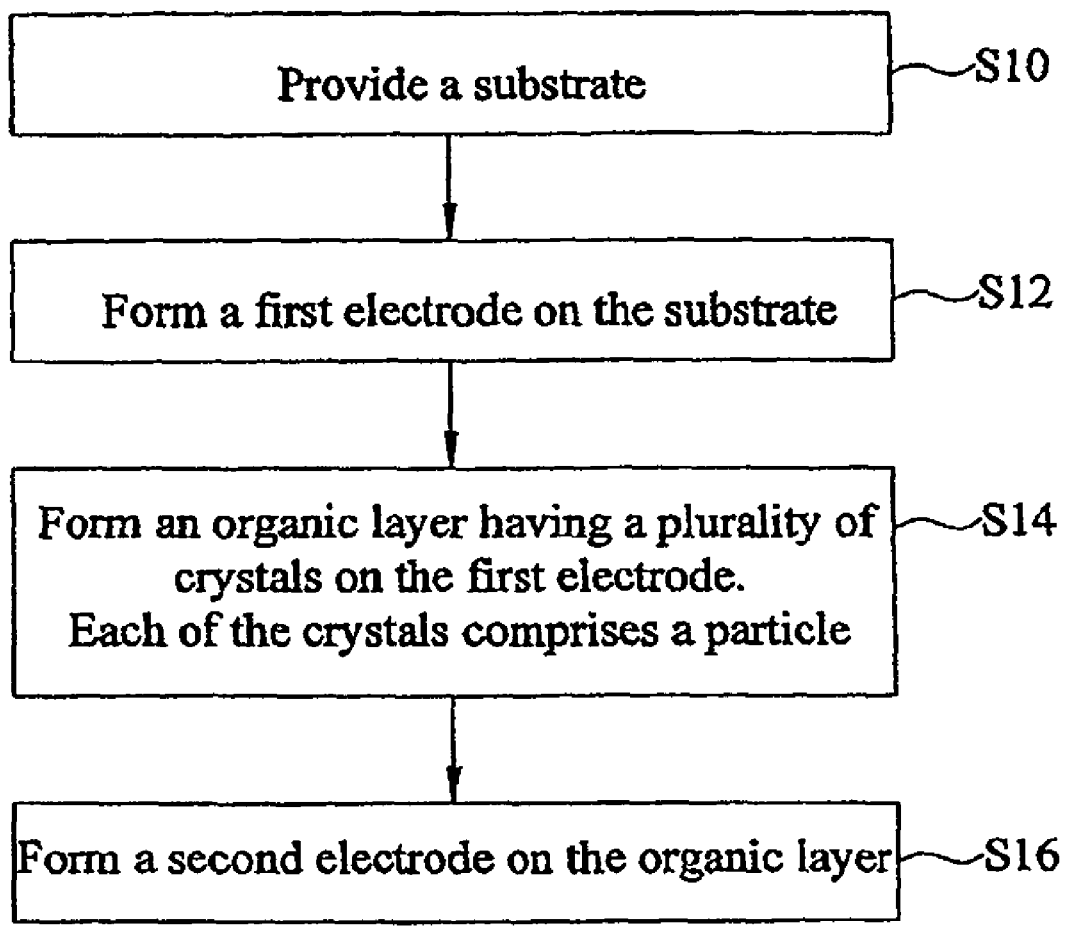
FIG. 1 is a flowchart illustrating a method for manufacturing an organic electroluminescence device according to one embodiment of the present invention.

Some embodiments of the present invention are described in detail below, in which elements indicated by the same reference numerals are the same or with similar functions, and the accompanying drawings are not drawn to scale and are merely intended to demonstrate structure features of the present invention. In the following detailed description, it will be understood that when an element is referred to as being "on" another element, it can be directly on the other element or intervening elements may also be present. In contrast, when an element is referred to as being "directly on" another element, there are no intervening elements present.

First, one embodiment of the present invention is to provide a method for manufacturing an organic electroluminescence device, which can improve charge injection ability and luminescence performance of the organic electroluminescence device without affecting the current manufacturing process of the organic electroluminescence device.

Figure 2A:
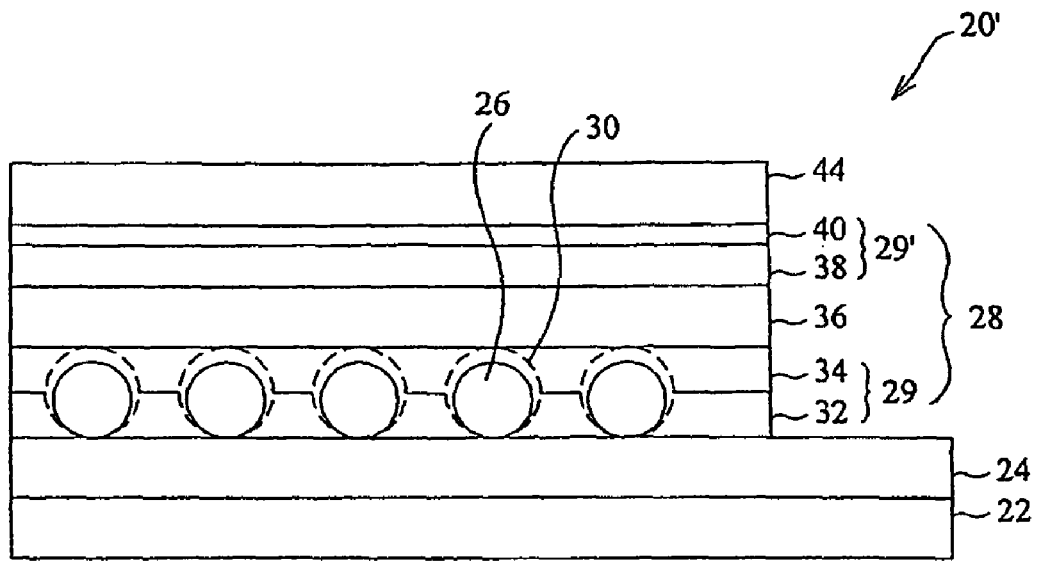
FIG. 2A is a schematic cross-sectional view of an organic electroluminescence device in accordance with one embodiment of the present invention.

FIG. 1 is a flowchart illustrating a method for manufacturing an organic electroluminescence device according to one embodiment of the present invention, and FIG. 2A is a schematic cross-sectional view of an organic electroluminescence device 20' in accordance with one embodiment of the present invention.

Referring to FIG. 1 and FIG. 2A, in step S10, a substrate 22 is firstly provided. The substrate 22 may be of glass or plastic, which can be determined according to actual needs of the organic electroluminescence device 20'.

Then, in step S12, a first electrode 24 is formed on the substrate 22. When the first electrode 24 is used as an anode, the first electrode 24 may comprise transparent metal oxides, such as indium tin oxide (ITO), indium zinc oxide (IZO), aluminum zinc oxide (AZO), zinc oxide (ZnO) or similar materials, or opaque metals, such as gold, silver, aluminum, platinum or other similar materials. The first electrode 24 may be formed by, for example, sputtering, electron beam evaporation, thermal evaporation, chemical vapor deposition or other methods, and the present invention is not limited thereto. In this embodiment, the first electrode 24 is an anode, which is made of indium tin oxide with a thickness of about 30 nm.

Referring to step S14, an organic layer 28 having a plurality of crystals 30 is formed on the first electrode 24, and each of the crystals 30 comprises a particle 26. The organic layer 28 comprises an emitting film (EL) 36 in which an exciton is generated by combination of an electron and a hole. Varying materials of the emitting film 36 can obtain various luminescence mechanisms with different colors. According to one embodiment, forming the organic layer 28 may further comprise steps for forming one or more sub-organic layers 29/29'. The sub-organic layers 29/29' are usually provided to enhance the luminescence performance of the emitting film 36. The sub-organic layers 29/29' can be a hole injection film 32, a hole transport film 34, an electron transport film 38, an electron injection film 40, or any combination thereof.

In this embodiment, particles 26 of silicon material with a diameter of 0.2 μm are directly distributed on a surface of the first electrode 24, and then the hole injection film 32, the hole transport film 34, the emitting film 36, the electron transport film 38 and the electron injection film 40 of the organic layer 28 are sequentially deposited on the first electrode 24 by a vapor deposition method. During the deposition of the organic materials, the particles 26, acting as crystal nucleuses, induces the crystallization of the organic materials to form the crystals 30. The sub-organic layers 29' can be formed simultaneously with the crystals 30. In this embodiment, the organic layer 28 of the organic electroluminescence device 20' comprises an organic small molecular material, and the organic layer 28 can be formed by a thermal evaporation method under a condition of a high temperature, for example, of about 280☐ to about 500☐, and a low pressure, for example, of about $10^{-6}$ torr.

In this embodiment, the hole injection film 32 is formed of 4,4',4"-tris [N, (3-methylphenyl)-N-phenyl-amino]-triphenylamine (m-TDATA) with a thickness of about 5 nm, the hole transport film 34 is formed of 4,4'-bis[N-(1-naphthyl)-N-phenylamino]biphenyl (α-NPD) with a thickness of about 10 nm, the electron transport film 38 is formed of bis(10-hydroxybenzo [h] quinolinato)beryllium (BeBq2) with a thickness of about 30 nm, and the electron injection film 40 is formed of lithium fluoride (LiF) with a thickness of about 1 nm. The emitting film 36 may be formed, for example, of a host material of 8-hydroxyquinoline aluminum (Alq3) doped with an appropriate amount of a red fluorescent dopant of RD3 (available from Kodak), or of a host material of 8-hydroxyquinoline aluminum (Alq3) doped with an appropriate amount of a green fluorescent dopant of 10-(2-Benzothiazolyl)-2,3,6,7-tetrahydro-1,1,7,7-tetramethyl-1H,5H,11H-(1) benzopyropyrano(6,7-8 -1,j)quinolizin-11-one (C545T), or of a host material of 10-(2-Benzothiazolyl)-2,3,6,7-tetrahydro-1,1,7,7-tetramethyl-1H,5H,11H-(1)benzopyropyrano(6,78 -1,j)quinolizin-11-one (ADN) doped with an appropriate amount of a blue fluorescent dopant of Bis [4-(di-p-tolylamino)styryl]biphenyl (DPAVBi). However, materials and thickness of the above-mentioned films may be varied according to actual needs, and the present invention is not limited thereto.

After that, in step S16, a second electrode 44 is formed on the organic layer 28. When the second electrode 44 is used as a cathode, the second electrode 44 may comprise any material capable of injecting electrons into the emitting film 36, such as a low work-function material. In this embodiment, the second electrode 44 is a cathode, which is made of indium zinc oxide with a thickness of about 80 nm.

In embodiments of the present invention, while crystals 30 exists in the organic layer 28, the organic electroluminescence device 20' is provided with preferred charge injection ability and luminescence performance.

Referring to the embodiment illustrated in FIG. 2A, the organic layer 28 of the organic electroluminescence device 20' comprises the sub-organic layers 29 and 29' respectively disposed between the emitting film 36 and the first electrode 24, and disposed between the emitting film 36 and the second electrode 44. In which, the sub-organic layer 29 comprises the hole injection film 32 and the hole transport film 34, and the sub-organic layer 29' comprises the electron transport film 38 and the electron injection film 40.

In this embodiment, the crystals 30 are in the sub-organic layer 29, and for forming the sub-organic layer 29, the particles 26 can be distributed on the first electrode 24, followed by forming the sub-organic layer 29 including the crystals 30 by evaporating an organic material, wherein the sub-organic layer 29 and the crystals 30 are formed at the same time. Referring to FIG. 2A, the crystals 30 are in the hole injection film 32 and the hole transport film 34 of the sub-organic layer 29.

Conventionally, to crystallize organic small molecular materials for forming organic films by an evaporation method is difficult. Therefore, the conventional organic films formed from the organic small molecular materials are normally of non-crystalline structures. However, the embodiments of the present invention provides the particles 26 which can act as crystal nucleus to induce the crystallization of the organic small molecular materials and form the crystals 30 in the organic layer 28. For the organic electroluminescence device 20', the crystals 30 in the organic layer 28 are provided with higher electron mobility than that of the non-crystalline structures of the organic layer 28, and thus both the charge injection ability and luminescence performance of the organic electroluminescence device 20' can be improved. In this embodiment, while measuring the luminance at a constant current density of 20 Ma/cm², the organic electroluminescence device 20' with the crystals 30 demonstrates a luminescence performance 20% higher than that with non-crystalline structures.

In the embodiments of the present invention, the particles 26 are mainly used as crystal nucleus for inducing the organic layer 28 to form the crystals 30, and the materials, sizes and shapes of the particles 26 are not important factors for the implementation of the present invention. However, the sizes of the particles 26 are generally determined according to actual needs and may be of about 10 to about 80,000 Å, and the particles 26 can be selected from a group consisting of Groups IIIB, IVB, VB, VIB, VIIIB, IB, IIB, IIIA and IVA of the periodic table, such as selected from Sc, Ti, V, Cr, Mn, Fe, Co, Ni, Cu, Zn, B, Al, C, Si or combinations thereof.

In this embodiment, the crystals 30 formed by the induction of each of the particles 26 are substantially of round shape. The diameters of the crystals 30 can be determined according to the organic small molecular material of the organic material 28 and may be generally of about 1 μm to about 70 μm. Each of the particles 26 will cause a luminous dot area substantially of round shape during the operation of the organic electroluminescence device 20', and the luminous dot area has a diameter of about 1 μm to about 90 μm.

In one embodiment, the particles 26 on the first electrode 24 preferably have a distribution concentration of 60% to 80% area per square meters.

Figure 2B:
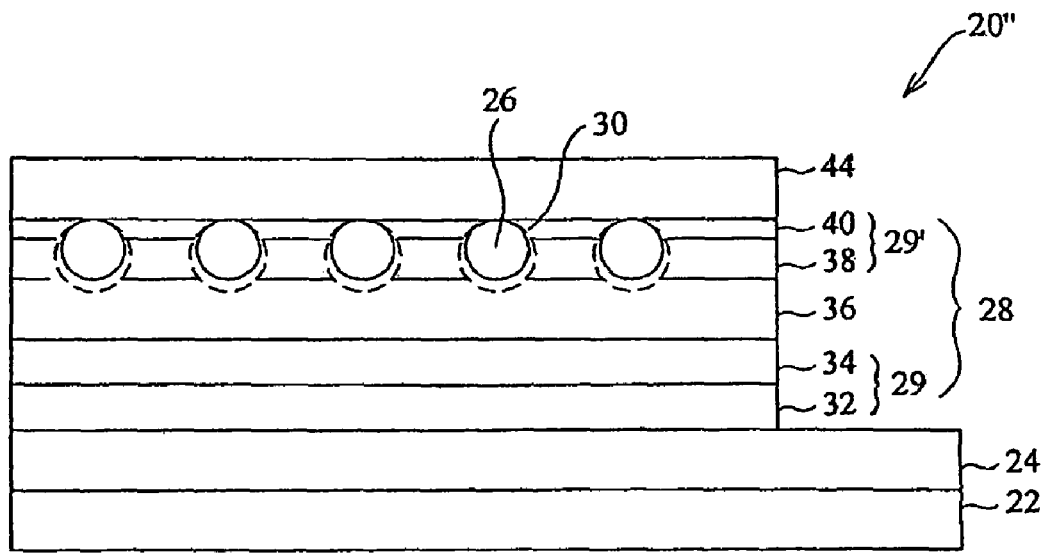
FIG. 2B is a schematic cross-sectional view of an organic electroluminescence device in accordance with another embodiment of the present invention.

Although in this embodiment, the crystals 30 are substantially formed in the sub-organic layer 29 of the organic layer 28 that is close to the first electrode 24. However, the present invention is not limited thereto. For example, FIG. 2B is a schematic cross-sectional view of an organic electroluminescence device 20" in accordance with another embodiment of the present invention, in which the crystals 30 are formed in the sub-organic layer 29', e.g. the electron transport film 38 and the electron injection film 40. The elements indicated by the same reference numerals are the same or with similar functions, and thus detailed descriptions therefore can be omitted here.

Figure 2C:
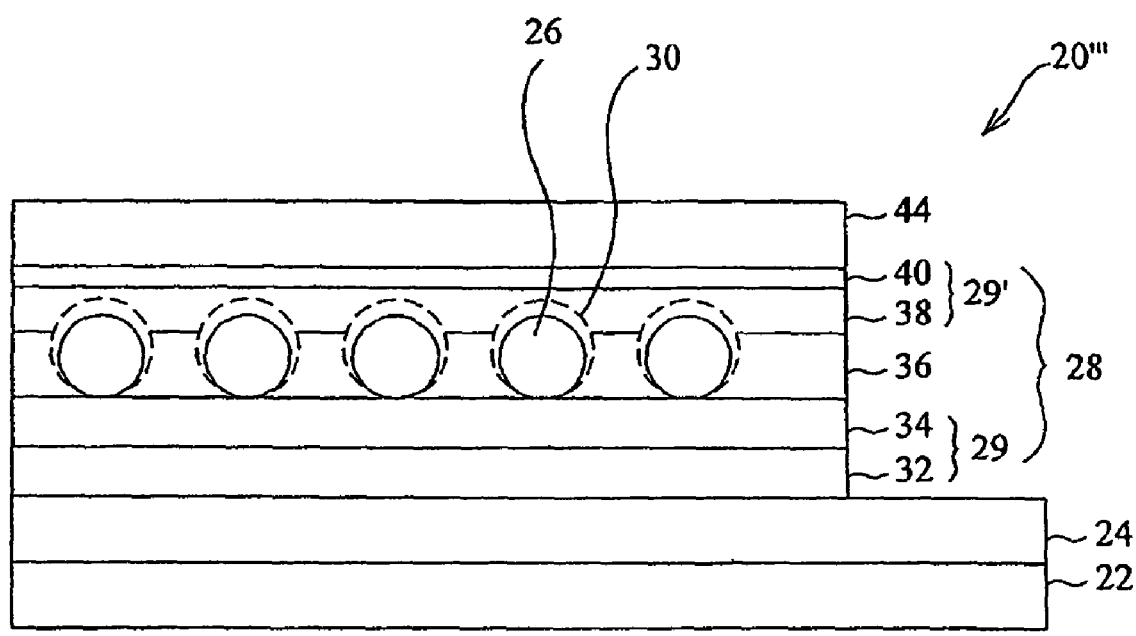
FIG. 2C is a schematic cross-sectional view of an organic electroluminescence device in accordance with further another embodiment of the present invention.

FIG. 2C is a schematic cross-sectional view of an organic electroluminescence device 20''' in accordance with further another embodiment of the present invention. In this embodiment, the plurality of crystals 30 are formed in the emitting film 36, and the steps of forming the emitting film 36 comprise distributing the plurality of particles 26 on, for example, the hole transport film 34 of the sub-organic layer 29, followed by forming the emitting film 36 by depositing a luminous material. The particles 26 is acting as a crystal nucleus to induce the crystallization of the luminous materials, wherein the emitting film 36 and the crystals 30 are formed at the same time.

In the embodiments of the present invention, the particles 26 may be distributed on a surface of an electrode or on a certain film of the organic layer 28 optionally, and the particles 26 can be distributed before or during the step of depositing the organic layer 28 of an organic small molecular material, allowing the particles 26 to be acted as crystal nucleus for inducing the organic layer 28 to form the crystals 30, and thus the charge injection ability and luminescence performance of the electroluminescence devices (20', 20", 20''') are improved. In the embodiments of the present invention, the thickness of the hole injection film 32, the hole transport film 34, the emitting film 36, the electron transport film 38 and the electron injection film 40 of the organic layer 28 are not specifically limited, which can be varied according to actual needs. The particles 26 and the crystals 30 can be presented in one or more films of the organic layer 28 according to the size of the particles 26 as well as the thickness and the material of each film of the organic layer 28, and the present invention is not limited thereto.

In practical applications, the organic films of the organic layer 28 can be added or reduced according to actual needs, and the present invention is not limited to the structures illustrated in the above embodiments.

In the embodiments of the present invention, the organic layer 28 may simply be induced to form the crystals 30 by the particles 30, and thus the charge injection ability, current efficiency and power efficiency of the electroluminescence devices (20', 20", 20''') can be improved easily and efficiently without affecting the current manufacturing processes.

Figure 3:
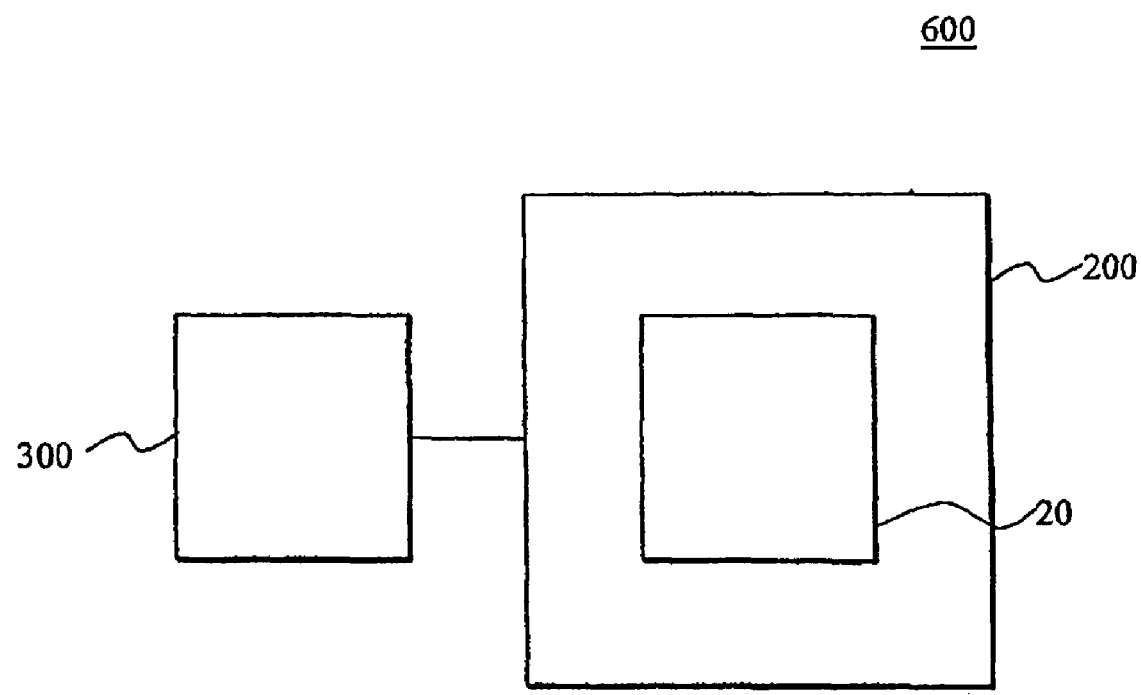
FIG. 3 shows the schematic configuration of an image display system in accordance with one embodiment of the present invention.

FIG. 3 shows the schematic configuration of an image display system 600 in accordance with one embodiment of the present invention, wherein the image display system 600 comprises a display panel 200 including the electroluminescence device 20 in accordance with the above embodiments. The image display system 600 further comprises an input unit 300 coupled with the display panel 200, wherein the input unit 300 transmits a signal to the display panel 200, so as to make the display panel 200 display images. The image display system 600 in accordance with this embodiment may be, for example, a mobile phone, a digital camera, a personal data assistant (PDA), a laptop, a desktop computer, a television, an in-car cinema or a portable media player.

Although specific embodiments have been illustrated and described, it will be obvious to those skilled in the art that various modifications may be made without departing from what is intended to be limited solely by the appended claims. Obviously, many modifications and variations of the present invention are possible in light of the above teachings. It is therefore to be understood that within the scope of the appended claims, the present invention may be practiced otherwise than as specifically described herein.

The invention claimed is:

1. A method for manufacturing an organic electroluminescence device, comprising:
providing a substrate;
forming a first electrode on the substrate;
forming an organic layer having a plurality of crystals on the first electrode, each of the crystals comprising a particle, the organic layer including an emitting film with the crystals therein; and
forming a second electrode on the organic layer,
wherein the step of forming the emitting film comprises:
distributing the particles on the first electrode, and
forming the emitting film by depositing a luminous material and using the particles as a crystal nucleus to induce a crystallization of the luminous material so as to form the crystals around the crystal nucleus, wherein the emitting film and the crystals are formed at the same time.

2. The method of claim 1 wherein the particles on the first electrode have a distribution concentration of 60% to 80% area per square meters.

3. A method for manufacturing an organic electroluminescence device, comprising:
providing a substrate;
forming a first electrode on the substrate;
forming an organic layer having a plurality of crystals on the first electrode, each of the crystals comprising a particle, the organic layer including an emitting film; and
forming a second electrode on the organic layer,
wherein the step of forming the organic layer further comprises forming a sub-organic layer with the crystals therein, and wherein the step of forming the sub-organic layer comprises:
distributing the crystals on the first electrode; and
forming the sub-organic layer by depositing an organic material, allowing using the particles as a crystal nucleus to induce a crystallization of the organic material so as to form the crystals around the crystal nucleus, wherein the sub-organic layer and the crystals are formed at the same time.

4. The method of claim 3, wherein the sub-organic layer is selected from a group consisting of an electron transport film, an electron injection film, a hole transport film and a hole injection film.

5. The method of claim 3, wherein the particles on the first electrode have a distribution concentration of 60% to 80% area per square meters.

6. The method of claim 3, wherein the step of forming the organic layer having the crystals comprises forming the organic layer by an evaporation method.

7. The method of claim 3, wherein the organic layer comprises an organic small molecular material.

8. The method of claim 3, wherein sizes of the particles are in the range of 10 to 80,000 Å.

9. An image display system, comprising:
an organic electroluminescence device that comprises:
a substrate;
a first electrode on the substrate;
an organic layer formed of organic small molecular materials on the first electrode, the organic layer including an emitting film with a plurality of crystals therein; and
a second electrode on the organic layer,
wherein each of the crystals comprises a particle that acts as a crystal nucleus to induce crystallization of the organic small molecular materials and form the crystals in the emitting film.

10. The image display system of claim 9, wherein sizes of the particles are in the range of 10 to 80,000 Å.

11. An image display system, comprising:
an organic electroluminescence device that comprises:
a substrate;
a first electrode on the substrate;

an organic layer formed of organic small molecular materials on the first electrode, the organic layer including an emitting film; and a second electrode on the organic layer, wherein the organic layer further comprises a sub-organic layer with a plurality of crystals therein, and each of the crystals comprises a particle that acts as a crystal nucleus to induce crystallization of the organic small molecular materials and form the crystals in the sub-organic layer, and wherein the sub-organic layer is selected from a group consisting of an electron transport film, an electron injection film, a hole transport film and a hole injection film.

12. The image display system of claim 11, wherein sizes of the particles are of 10 to 80,000 Å.

13. The image display system of claim 11, further comprising:

an display apparatus, the display apparatus comprising the organic electroluminescence device.

14. The image display system of claim 13, further comprising:

an electronic apparatus, wherein the electronic apparatus comprises:

the display apparatus; and an input unit coupled with the display apparatus, wherein the input unit transmits a signal to the display apparatus, so as to make the display apparatus display images.

15. The image display system of claim 14, wherein the electronic apparatus is a mobile phone, a digital camera, a personal data assistant (PDA), a laptop, a desktop computer, a television, an in-car cinema or a portable digital media player.

* * * * *